United States Patent [19]

Hong

[11] Patent Number: 5,534,447
[45] Date of Patent: Jul. 9, 1996

[54] PROCESS FOR FABRICATING MOS LDD TRANSISTOR WITH POCKET IMPLANT

[75] Inventor: Gary Hong, Hsinchu, Taiwan

[73] Assignee: United Microelectronics Corporation, Hsinchu, Taiwan

[21] Appl. No.: 558,115

[22] Filed: Nov. 13, 1995

[51] Int. Cl.$^6$ .................................................. H01L 21/8234
[52] U.S. Cl. ................................ 437/27; 437/41; 437/44; 257/344; 257/345
[58] Field of Search ........................ 437/27, 29, 41 CS, 437/44; 257/336, 344, 345

[56] References Cited

U.S. PATENT DOCUMENTS

| | | | |
|---|---|---|---|
| 5,082,794 | 1/1992 | Pfiester et al. | 437/40 |
| 5,374,575 | 12/1994 | Kim et al. | 437/44 |
| 5,389,557 | 2/1995 | Jung-Suk | 437/44 |
| 5,434,093 | 7/1995 | Chau et al. | 437/41 |
| 5,472,897 | 12/1995 | Hsu et al. | 437/44 |
| 5,484,743 | 1/1996 | Ko et al. | 437/44 |

FOREIGN PATENT DOCUMENTS 5-283688A 10/1993 Japan ..................................... 257/345

Primary Examiner—Mary Wilczewski
Assistant Examiner—Richard A. Booth
Attorney, Agent, or Firm—Townsend and Townsend and Crew

[57] ABSTRACT

A process for fabricating MOS transistor devices on a semiconducting substrate first forms a shielding layer, having an opening with sidewalls therein, over the substrate to define a channel region. Then, first sidewall spacers are formed on the sidewalls and a gate insulating layer is formed within the confinement of the first sidewall spacers. Next, a gate electrode is formed over the gate insulating layer, and then the first sidewall spacers are removed, thereby forming trenches between the edges of the gate electrode and the shielding layer. Afterwards, lightly-doped regions of a second conductivity type are formed beneath the trenches and doped regions of the first conductivity type are formed to surround the lightly-doped regions. After removing the shielding layer, second sidewall spacers are formed to overlie the lightly-doped regions. Finally, heavily-doped regions of the second conductivity type are formed in the substrate adjacent to both the lightly-doped region and the doped region of the first conductivity type. This fabrication procedure ensures that the junction capacitance is kept low to improve the operational speed characteristics of the MOS transistor.

7 Claims, 4 Drawing Sheets

PROCESS FOR FABRICATING MOS LDD TRANSISTOR WITH POCKET IMPLANT

BACKGROUND OF THE INVENTION

1. Field of the Invention

The present invention relates in general to a process for fabricating semiconductor MOS transistors. In particular, the present invention relates to a process for fabricating MOS transistors having reduced junction capacitance which improves their operating characteristics.

2. Technical Background

MOS transistors are the basic building blocks for various semiconductor integrated circuit devices. As semiconductor integrated circuit devices become ever smaller in size as a result of advancements in the semiconductor fabrication technology, MOS transistors found in integrated circuit devices are also becoming ever smaller in their physical dimensions. However, as the component dimensions continue to shrink, the length of the transistor channel region is reduced as well, which decreases the punch-through voltage for that region. To prevent punch-through in the channel regions of these tiny transistors, it has been proposed to surround the N-type source and drain regions of the transistor with P-type impurities-doped regions. However, such a P-N surrounding arrangement adds to the junction capacitance therebetween, which jeopardized the operating characteristics of such transistors.

A brief description of a conventional MOS transistor device is included below to assist in the understanding of the present invention. FIG. 1 of the accompanying drawing schematically shows a cross-sectional view of a conventional MOS transistor.

As is seen in FIG. 1, a silicon substrate 10 is supplied as the base for fabricating the MOS transistor device. The substrate 10 may be, for example, a P-type substrate. N-type heavily-doped regions 110 and N-type lightly-doped regions 112, designated $N^+$ and $N^-$ in the drawing, respectively, are formed at the appropriate locations of the substrate 10 as source/drain regions to constitute a LDD (lightly-doped drain) structure well known in this art. A channel region 120 is located between the lightly-doped regions 112 as is seen in the drawing.

Each of the P-type pockets 130 is formed to surround both of the $N^+$ and $N^-$ regions 110 and 112 respectively, as intended by the prior art technique to prevent punch-through between the source/drain regions. Gate oxide layer 140 is formed over the surface of the substrate 10, and the gate electrode 150 is formed over the surface of the gate oxide layer 140 that is located above the channel region 120.

As FIG. 1 shows, the miniaturization of the entire MOS transistor device reduces the physical dimension of the channel region 120. As a result, the channel length is also reduced. This reduces the punch-through voltage of the channel region 120. Although one P-type pocket 130 is provided for each of the surrounding $N^+$ regions 110 and $N^-$ regions 112, this arrangement increases the junction capacitance therebetween. As persons skilled in the art can appreciate, this increased junction capacitance deteriorates the operational characteristics of the MOS transistor device, in particular, its operational speed.

SUMMARY OF THE INVENTION

It is therefore an object of the present invention to provide a process for fabricating MOS transistor devices having reduced junction capacitance for improving operational characteristics.

The present invention achieves this by providing a process for fabricating MOS transistor devices over a semiconductor silicon substrate. The process comprises first forming a shielding layer over the surface of the substrate which has an opening with two sides that defines the channel region for the MOS transistor device within the substrate. A first set of sidewall spacers is then formed on the sides. An electrically conducting layer is then formed over the gate insulation layer formed within the confinement of the first sidewall spacers. The electrically conducting layer serves as the gate terminal for the MOS transistor device. The first sidewall spacers are then removed, thereby forming trenches between the edges of the gate terminal and the shielding layer. The gate terminal and the shielding layer are utilized as a shielding mask for subsequently implanting impurities of the first and second conductivity types into the substrate of the first conductivity type, thereby respectively forming a relatively lightly-doped region of the second conductivity type, as well as a first conductivity type doped region that generally surrounds the lightly-doped region of the second conductivity type. After the removal of the shielding layer, second sidewall spacers are formed on the sidewalls. Finally, the process utilizes the gate terminal and the second sidewalls as a shielding mask for implanting impurities of the second conductivity type into the substrate of the first conductivity type, thereby forming a relatively heavily-doped region of the second conductivity type that is adjacent to both the lightly-doped region of the second conductivity type and the first conductivity type doped region to thereby form the drain and source regions for the MOS transistor device. The fabrication procedure ensures that the junction capacitance is kept low, which improves the operational speed characteristics.

BRIEF DESCRIPTION OF THE DRAWINGS

Other objects, features, and advantages of the present invention will become apparent by way of the following detailed description of the preferred but non-limiting embodiments. The description is made with reference to the accompanied drawings.

DESCRIPTION OF THE PREFERRED EMBODIMENT

A presently preferred embodiment of the process of the present invention for fabricating MOS transistor devices with reduced junction capacitance is described below. The MOS transistor device is fabricated on a semiconductor silicon substrate 20 of a first conductivity type, which may be either an N- or P-type silicon substrate. In the exemplified embodiment, a P-type substrate 20 is used. The process involves the following steps.

Stage 1

Figure 1:
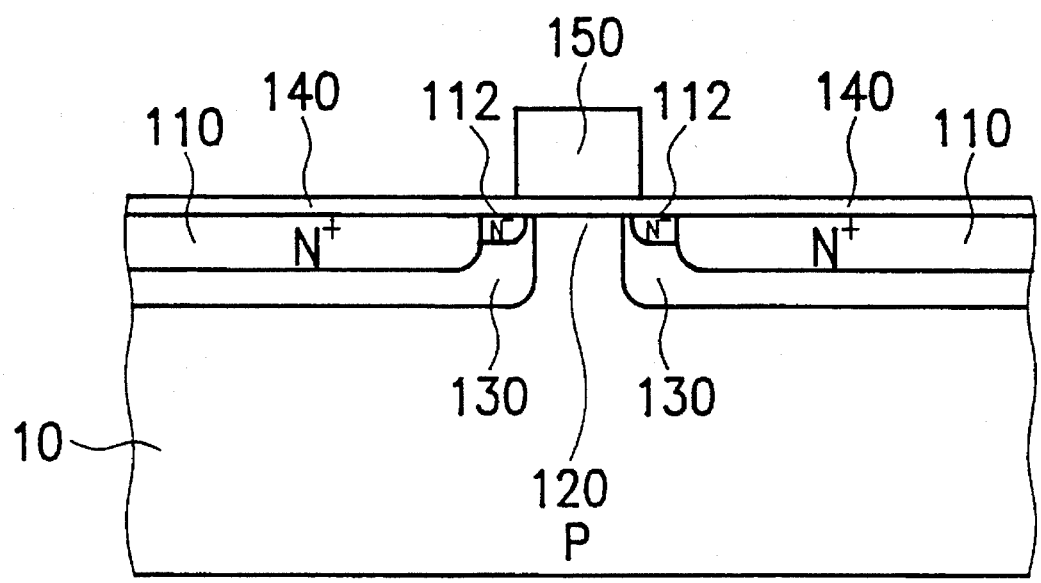
FIG. 1 is a cross-sectional view of a conventional MOS transistor.
Figure 2A:
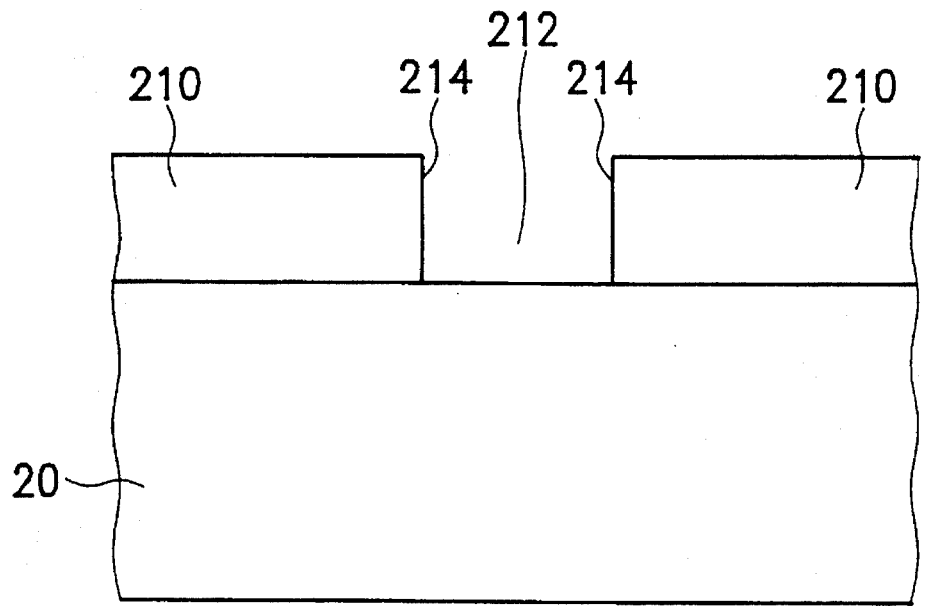
FIGS. 2a-2f are cross-sectional views of a MOS transistor device fabricated in accordance with a preferred embodiment of the present invention, and they show selected stages of its fabrication process.

Referring to FIG. 2a, a shielding layer 210 including an opening 212 is formed over the surface of the substrate 20 at the designated locations. Sides or sidewalls 214 of the opening 212 in the shielding layer 210 define the boundary of the channel region for the MOS transistor.

The shielding layer 210, with its opening 212, can be formed by, for example, depositing a layer of oxide 210 by chemical vapor deposition (CVD). The thickness of the deposited oxide layer may be, for example, in the range of about 1,000–4,000 Å. Photolithography may be employed to form the opening 212 in a controlled etching procedure.

Stage 2

Figure 2B:
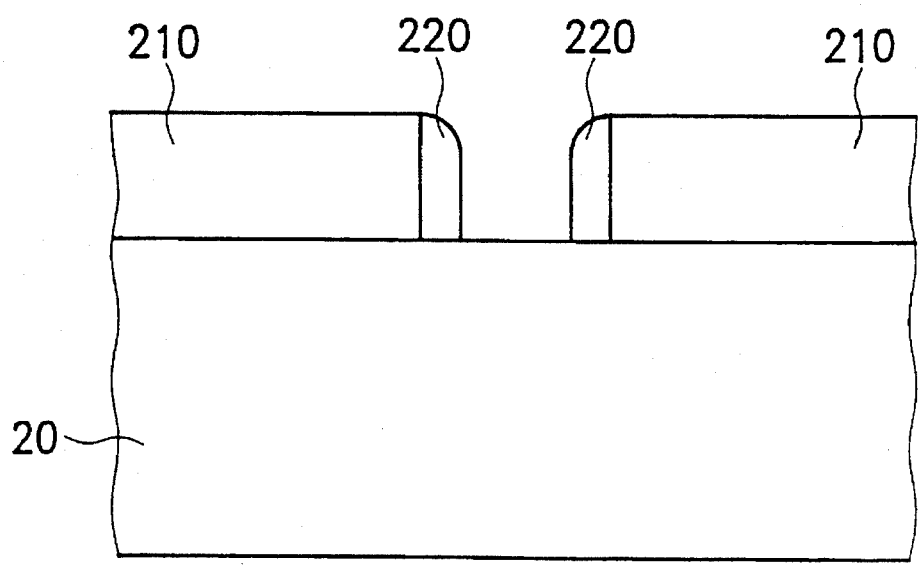

Referring to FIG. 2b, first sidewall spacers 220 are formed on sidewalls 214 of opening 212. This can be done, for example, by first depositing a layer of nitride with a thickness of about, for example, 500–2,000 Å. An etching-back procedure is then performed to form the first sidewall spacers 220.

Stage 3

Figure 2C:
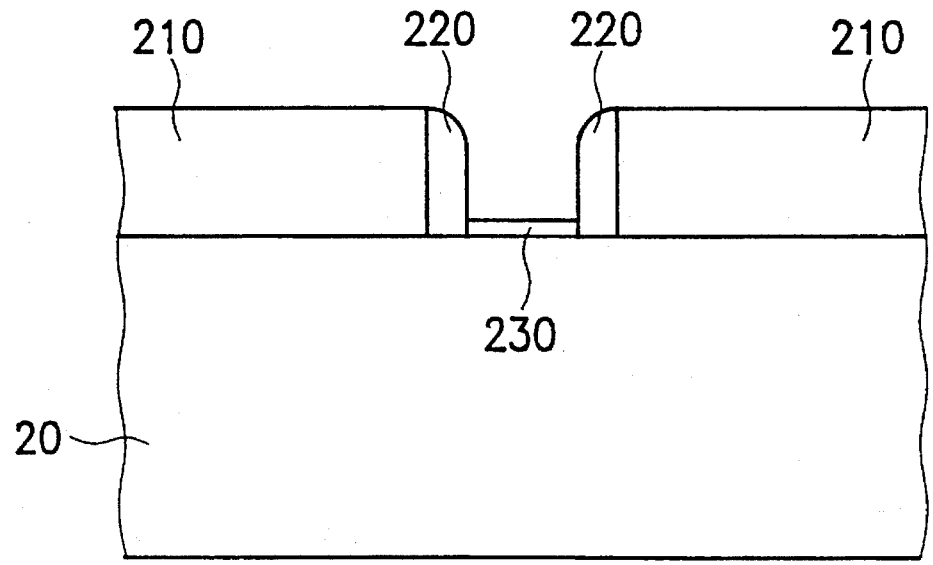

Next, as seen in FIG. 2c, a gate insulation layer 230 is formed on the surface of the substrate 20 confined by the first sidewall spacers 220.

This is achieved, for example, by growing the gate oxide layer 230 in a thermal oxidation procedure to a thickness of about 100 Å.

Stage 4

Figure 2D:
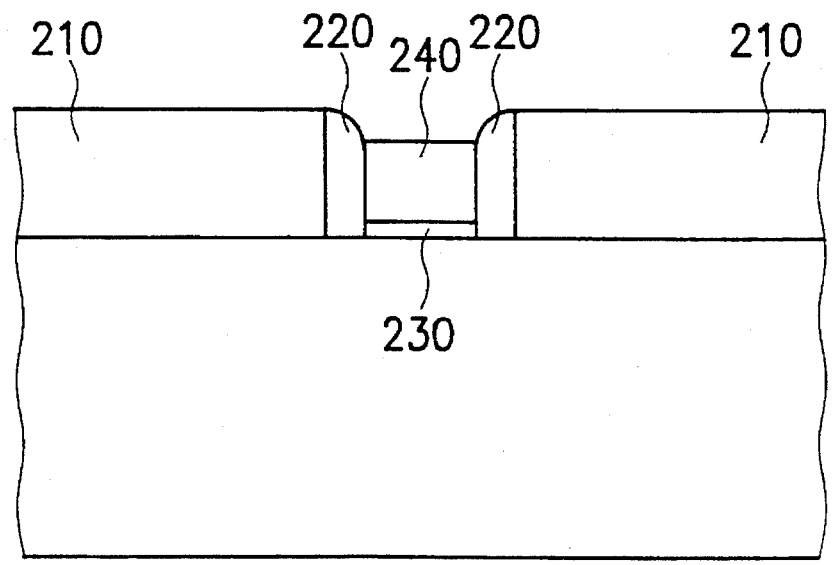

Referring to FIG. 2d, an electrically conducting layer 240 is next formed over the surface of the gate insulation layer 230 within the confines of the first sidewall spacers 220. The electrically conducting layer 240 may be utilized as the gate terminal for the MOS transistor being fabricated.

This is done, for example, by first depositing a layer of polysilicon, with a thickness of, for example, about 2,000–6,000 Å, followed by an ion implantation procedure that implants impurities to a controlled depth of the polysilicon layer. The purpose of the implantation of the impurities is principally to decrease the resistance of the deposited polysilicon layer. An etching-back, or, chemical-mechanical polishing (CMP) procedure is then performed to form the gate terminal 240.

Stage 5

Figure 2E:
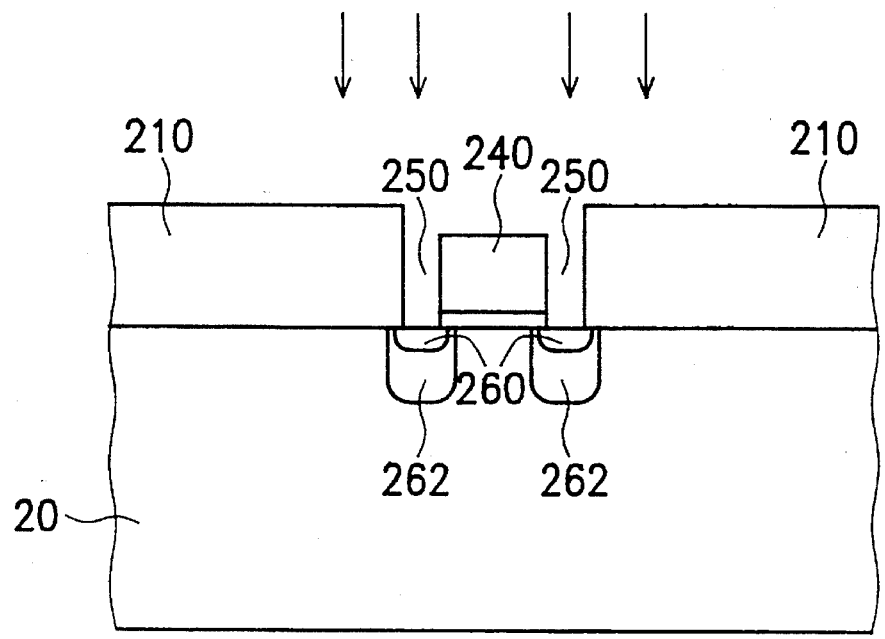

As is illustrated in FIG. 2e, the first sidewall spacers 220 are removed to form trenches 250 which are confined by gate terminal 240 and shielding layer 210. The gate terminal and the shielding layer are utilized as a shielding mask for two consecutive ion implantation procedures to implant first and second conductivity type impurities into the substrate 20 of the first conductivity type. This forms a relatively lightly-doped region 260 of the second conductivity type and a surrounding first conductivity type doped region 262.

This can be achieved, for example, by removing the first sidewall spacers 220 before impurities such as, for example, boron (B) are implanted into the substrate 20. The implantation energy is, for example, in the range of about 40 keV. The achieved implantation impurity concentration is, for example, about 1E14 atoms/cm2. This forms the $N^-$ lightly-doped region 260. Afterwards, impurities such as, for example, phosphorus (P) are implanted into the substrate 20, at an implantation energy level of, for example, about 50 keV, with an achieved impurity concentration of, for example, about 2E13 atoms/cm2. This forms the P-type doped region 262 that generally surrounds the $N^-$ lightly-doped region 260. After the two consecutive ion implantation procedures, the shielding layer 210 is removed.

Stage 6

Figure 2F:
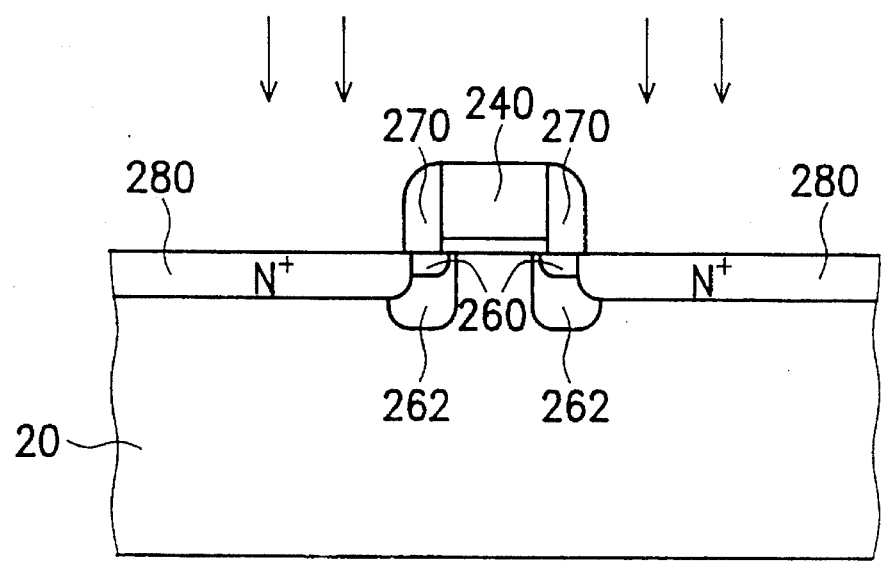

Finally, as shown in FIG. 2f, second sidewall spacers 270 are formed on the sides of the gate terminal 240. The gate terminal 240 and the second sidewall spacers 270 are used as a shielding mask for another ion implantation procedure which implants impurities of the second conductivity type into the substrate 20 of the first conductivity type. This forms the relatively heavily-doped region 280 of the second conductivity type that is adjacent to both the lightly-doped region 260 of the second conductivity type and doped region 262 of the first conductivity type.

This can be achieved, for example, by first depositing an oxide layer with a chemical vapor deposition (CVD) procedure, followed by an etching-back procedure to form the second sidewall spacers 270. Impurities such as, for example, arsenic (As) can be implanted at an implantation energy level of, for example, about 50 keV, achieving an implantation impurity concentration of, for example, about 3E15 atoms/cm2. This forms the $N^+$ heavily-doped region 280.

This generally concludes the process for the fabrication of MOS transistor device of the present invention. The automatic alignment characteristics of the fabrication steps of the present invention form doped regions of reverse polarity with respect to the polarities of the drain and source regions only in the edges of the channel region that are adjacent to the overall source/drain regions. This has the beneficial effect of preventing the punch-through in the transistor channel region, while drastically reducing the junction capacitance. A direct result of this reduced junction capacitance is an improved operational switching speed of the MOS transistor device.

What is claimed is:

1. A process for fabricating a MOS transistor device on a semiconducting substrate of a first conductivity type, comprising:

forming over said substrate a shielding layer having an opening with sidewalls defining a channel region;

forming first sidewall spacers on said sidewalls;

forming a gate insulating layer over said channel region;

forming a gate electrode over said gate insulating layer;

removing said first sidewall spacers to form trenches between said gate electrode and said shielding layer;

forming lightly doped regions of a second conductivity type in said substrate beneath said trenches, and forming doped regions of the first conductivity type that surround said lightly doped regions;

removing said shielding layer;

forming second sidewall spacers overlying said lightly doped regions; and forming heavily doped regions of the second conductivity type in said substrate adjacent to both said lightly doped region and said doped region of the first conductivity type.

2. The process claimed as claim 1, wherein said shielding layer is an oxide layer.

3. The process claimed as claim 1, wherein the method for forming said first sidewall spacers comprises:

forming a silicon nitride layer overlying said substrate; and etching back said silicon nitride layer to form said first sidewall spacers.

4. The process claimed as claim 1, wherein forming said gate insulating layer comprises forming an oxide layer by thermal oxidation.

5. The process claimed as claim 1, wherein forming said second sidewall spacers comprises:

forming a silicon oxide layer overlying said substrate; and etching back said silicon oxide layer to form said second sidewall spacers.

6. The process claimed as claim 1, wherein said first conductivity type is P-type and said second conductivity type is N-type.

7. The process claimed as claim 1, wherein said first conductivity type is N-type and said second conductivity type is P-type.

* * * * *